United States Patent [19]

Jarrett et al.

[11] 4,359,652

[45] Nov. 16, 1982

[54] OVER VOLTAGE DETECTION CIRCUIT FOR USE IN ELECTRONIC IGNITION SYSTEMS

[75] Inventors: Robert B. Jarrett, Tempe; James J. LoCascio, Mesa, both of Ariz.

[73] Assignee: Motorola, Inc., Schaumburg, Ill.

[21] Appl. No.: 166,865

[22] Filed: Jul. 7, 1980

[51] Int. Cl.³ .................... H03K 5/153; H02H 3/20
[52] U.S. Cl. ................................ 307/350; 307/363; 307/547; 315/209 T; 361/91
[58] Field of Search ............. 307/350, 362, 363, 542, 307/544, 547, 549, 553, 564, 566, 318; 128/644, 650, 651, 652; 315/209 T, 209 M; 340/660, 661, 662; 361/91

[56] References Cited

U.S. PATENT DOCUMENTS 3,268,881  8/1966  Vasel ................................. 307/318

Primary Examiner—John Zazworsky
Attorney, Agent, or Firm—Michael D. Bingham

[57] ABSTRACT

An over voltage detection circuit for utilization in conjunction with a series driver transistor type electronic ignition system which samples the voltage magnitude appearing at the collector of the series driver transistor to render the same nonconductive when a high voltage condition appears at the collector thereof. The over voltage detection circuit includes a voltage translation circuit for translating the level of the voltage appearing at the collector of the series driver transistor to a second level, and a sampling transistor the base of which is coupled to the voltage translation circuit and with the collector-emitter path coupled in series between the collector of the series driver transistor and an output of the detection circuit which is rendered conductive in response to the translated voltage exceeding a predetermined threshold level for supplying an output signal which is utilized to render the series driver transistor nonconductive.

6 Claims, 2 Drawing Figures

OVER VOLTAGE DETECTION CIRCUIT FOR USE IN ELECTRONIC IGNITION SYSTEMS

BACKGROUND OF THE INVENTION

1. Field of the Invention

The present invention relates to electronic ignition systems and more particularly to an over voltage detection circuit for use therein to protect the active components during load dump conditions.

2. Description of the Prior Art

Contemporary monolithic electronic ignition systems comprise a dwell control circuit portion and a power driver portion. The power driver portion is coupled to an external Darlington power amplifier that is connected in series between the primary of the ignition coil of the automobile and a sensing resistor which is utilized for sensing the magnitude of ignition coil current. Generally, as is known, in response to receiving timing signals generated in timed relationship to the engine operation, the dwell control portion of the electronic ignition system generates dwell control signals for turning on and off the power driver portion thereof during predetermined intervals of each firing cycle of engine operation. In turn, the power driver portion then renders the external Darlington amplifier conductive during a predetermined interval of the firing cycle operation to initiate current through the ignition coil. The sensing resistor is utilized to sense when the ignition coil current has ramped to a maximum operating level, which in some systems is equal to 6 amperes. At this level, the ignition coil current is limited by a feedback system coupled to the sensing resistor to the power driver portion of the ignition system. At the end of the particular firing cycle the dwell control circuit portion renders the power driver portion either conductive or nonconductive, accordingly, to shut off the external Darlington amplifier. This abruptly shuts off the current conducted therethrough and causes collapse of the field around the ignition coil to generate the spark for operating the engine as is generally understood.

In most contemporary monolithic electronic ignition systems the power driver portion comprises a "shunt" power driver transistor which is coupled at an external pin of the monolithic circuit via a small resistor to one of the battery terminals. The small value resistor is required by the automobile manufacturers for low battery cold temperature operating conditions and is typically 50 ohms. The collector of the shunt power driver transistor is coupled to the aforementioned external Darlington amplifier. During most of the firing cycle period the shunt power driver transistor is maintained in a conductive state by the dwell control circuitry to shunt current drive from the external Darlington amplifier. As aforedescribed, in response to the timing ignition signals, dwell control signals are then generated or, in the particular case, inhibited to render the shunt power device nonconductive which allows base current drive to be provided to the external Darlington amplifier and hence initiation of ignition coil current. Generally, a comparator is utilized to sense when the coil current has reached approximately 6 amperes to provide a signal to the shunt power driver transistor to render it conductive to limit the current drive to the external Darlington amplifier which causes the coil current to be limited at this value.

One problem with prior art "shunt" power drivers results from the fact that during most of a firing cycle the device is in a conductive state. Hence, the device is always dissipating power in the integrated circuit. Ideally, in any monolithic integrated circuit it is desirous to reduce power dissipation.

Another problem with the prior art type of ignition circuits described above relates to what is called a "load dump" condition generally specified by the automobile manufacturers. Under load dump conditions the integrated circuit and the external Darlington amplifier must withstand a high voltage condition (normally specified as 80 volts) occurring on the battery supply terminal without either circuit being overstressed or damaged. One manner in the prior art for protecting the external Darlington power amplifier under load dump conditions is to utilize an external resistive divider network connected to the battery supply terminal for sensing when the high voltage condition occurs. In this condition the shunt power driver device is rendered conductive which, as previously mentioned, renders the Darlington amplifier nonconductive to protect this device. However, in order to protect the Darlington amplifier the shunt power device will have essentially 80 volts at the collector thereof producing a collector current of approximately 1.6 amps therethrough. Hence, not only does the shunt power device have to be a large transistor, taking up a large part of the integrated circuit and reducing the number of components and devices which can be utilized thereon, but it also dissipates a large amount of power within the integrated circuit which is undesirous.

Hence, there is a need for providing over voltage protection during load dump conditions while eliminating the need for a large power device and also for reducing pwer dissipating in the integrated circuit.

SUMMARY OF THE INVENTION

Accordingly, it is an object of the present invention to provide an over voltage detection circuit for use in combination with an electronic ignition system for protecting the ignition system under high voltage conditions.

Another object of the present invention is to provide an over voltage detection circuit which can be fabricated in integrated circuit form for use in combination with an integrated circuit electronic ignition system.

Still another object of the present invention is to provide an over voltage detection circuit having a zero temperature coefficient.

In accordance with the foregoing and other objects there is provided an over voltage detection circuit which can be utilized in an integrated circuit electronic ignition system for protecting the power devices of the ignition system against high voltage conditions arising on the battery supply terminal connected to the ignition system. The over voltage detection circuit is configured to be operated in conjunction with an electronic ignition system including a series power device wherein the over voltage detection circuit is coupled between the collector and base of the series power device and comprises a resistive divider network coupled between the collector of the series driver device and a terminal at which is supplied a ground reference potential, a voltage sampling transistor having the base thereof coupled to the resistor divider network its collector coupled to the collector of the series power device, and a pair of zener diodes coupled between the emitter of the voltage sampling transistor to an output of the over voltage detection circuit such that the voltage appearing at the collector of the series power device is sampled to produce a control signal at the output of the over voltage detection circuit whenever the magnitude of the voltage appearing at the collector of the series power device exceeds a predetermined value for turning on the sampling transistor which in turn inhibits the conduction of the series power device.

DETAILED DESCRIPTION OF THE PREFERRED EMBODIMENT

Figure 1:
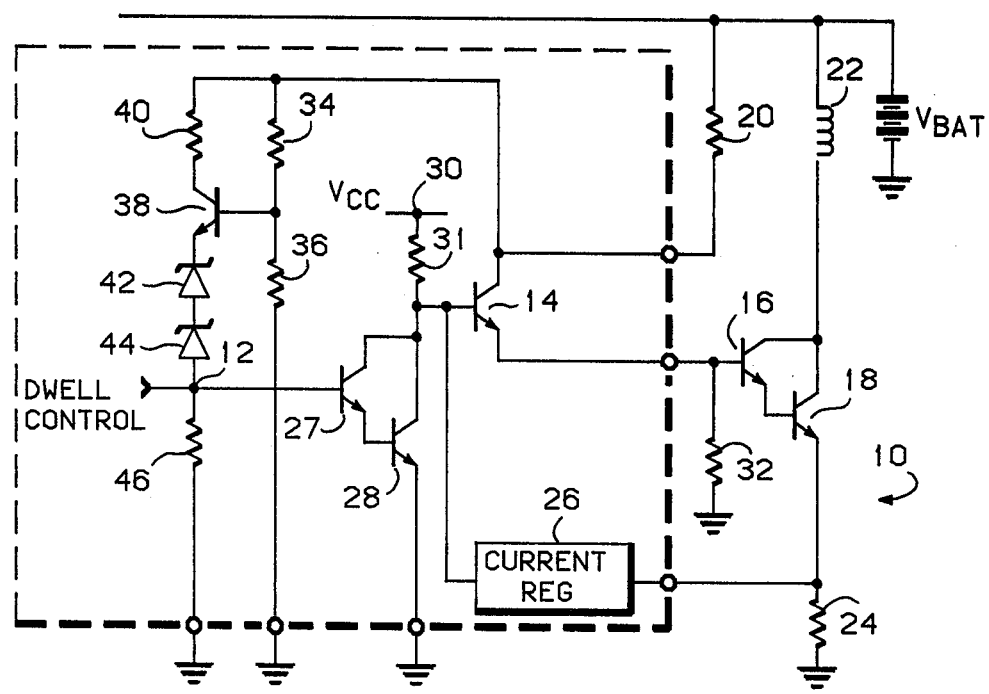
FIG. 1 is a schematic diagram of the embodiment of the present invention.

Turning to FIG. 1 there is shown a series driver type electronic ignition system 10 including the over voltage detection circuit of the present invention. Electronic ignition system 10 as generally known in the art comprises a dwell control circuit portion and an output power drive portion. In response to timing ignition signals generated in timed relationship with the operation of an automobile engine there are generated, in the dwell control portion of the circuit, dwell control signals which are then supplied at terminal 12 of electronic ignition system 10. As shown, the circuitry included within the dashed outline is suitable for manufacture in monolithic integrated circuit form with the components and devices shown outside thereof being external components being coupled to respective pins of the integrated circuit.

The dwell control signal supplied at terminal 12 may be generated by any well known dwell control circuitry in response to the timing signals which would be supplied at the inputs of the integrated circuit. For instance, U.S. Pat. No. 3,871,347 to Howard Weber, assigned to Motorola Inc., shows such an ignition system.

Electronic ignition system 10 is recognized as being of the series driver type in that the dwell control signals supplied at terminal 12 cause the series power device transistor 14 to be rendered conductive or nonconductive during the correct portion of a particular firing cycle of engine operation to render external Darlington amplifier, comprising transistors 16 and 18, conductive and then nonconductive accordingly. Generally, during most of a particular firing cycle, series driver transistor 14, as well as the external Darlington amplifier, are maintained in a nonconductive condition. In response to dwell control signals rendering the Darlington amplifier conductive current flows through the primary of ignition coil 22 via resistor 24 to ground. Thus, in this condition, current begins ramping upward through the ignition coil as shown by waveform 50 of FIG. 2. At a predetermined current level, typically near 6 amps, the current through ignition coil 22 is limited by the current sense regulator 26 limiting the current supply through series driver transistor 14 to the Darlington amplifier. The current limit time interval is shown by the flat upper portion of waveform 50 of FIG. 2. In response to dwell control signals generated at terminal 12, at the end of a particular firing cycle, transistors 27 and 28 which are shown connected in a Darlington configuration and coupled to the base of series driver 14 are rendered conductive to shunt base current drive supplied from a power supply conductor 30 via resistor 31 away from the base of series driver 14. This renders both the series driver device 14 as well as the external Darlington amplifier nonconductive to abruptly stop the current flow through ignition coil 22. Hence, the field about ignition coil 22 collapses to generate a spark to cause firing in the engine as is well understood.

The aforedescribed operation is well understood by those practitioners in the art. The over voltage detection circuit of the preferred embodiment is utilized in combination with the aforedescribed electronic ignition system to protect against high voltage conditions occurring at the battery supply terminal which is connected to the battery shown as the voltage $V_{BAT}$. The collector of the series driver device 14 is coupled via resistor 20 to the battery supply terminal as is one terminal of ignition coil 22. To prevent high voltage stress to either series power device 14 or the external Darlington amplifier, the over voltage detection circuit of the invention provides for rendering these devices nonconductive in the event that the voltage level at the battery supply terminal increases beyond a predetermined level which in the preferred embodiment may be approximately 30 volts. By utilizing a series driver device and understanding how the collector thereof behaves during a particular firing cycle, the over voltage detection circuit of the present invention was conceived for sensing the voltage at the collector of the series driver device to render the same nonconductive in the event of a high voltage condition appearing on the battery supply terminal.

Figure 2:
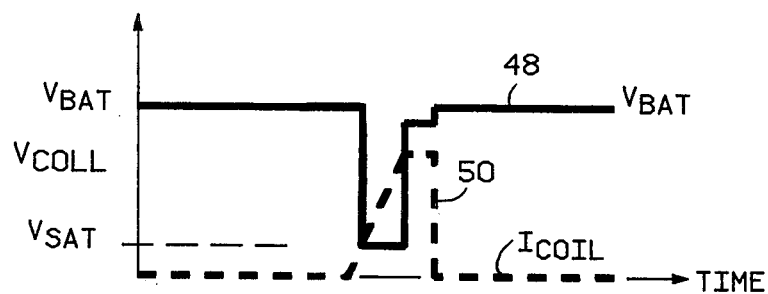
FIG. 2 is a waveform diagram useful for explaining the operation embodiment of FIG. 1.

Waveform 48 of FIG. 2 shows the collector voltage of transistor 14 during a particular firing cycle period. The voltage at the collector of transistor 14 is substantially equal to the battery supply voltage $V_{BAT}$ during most of the firing cycle until this device is rendered conductive by the particular dwell control signal supplied at terminal 12, i.e., when transistors 27 and 28 are rendered nonconductive and current begins ramping upward through ignition coil 22. With transistor 14 in an "on" state the voltage appearing at the collector thereof is equal to the saturation voltage of the device plus the two base-to-emitter voltage drops ($V_{be}$) of transistors 16 and 18. During the aforedescribed current limiting interval, the collector voltage of transistor 14 is substantially equal to the battery voltage minus the small value of collector current required through transistor 14 to maintain the base current drive to the external Darlington amplifier. Hence, the collector of transistor 14 is substantially equal to the battery supply voltage at all times except during the current ramp portion of a particular firing cycle, when the voltage at the collector thereof is equal to the saturation voltage of the device plus the $V_{be}$ voltage drop across transistors 16 and 18.

The worse case for an over voltage condition to occur at the battery supply terminal is during the coil current limiting interval when the Darlington amplifier is in an active state. In this condition, any high voltage appearing at the battery power supply terminal would be developed across the transistors 16 and 18 of the Darlington amplifier which could cause over stressing thereof. However, during current limiting the collector of transistor 14, as previously discussed, is substantially equal to the battery supplied voltage. Hence, if an over voltage condition should occur during current limiting, the voltage at the collector of transistor 14 would increase proportionately. Hence, over voltage detection circuit of the present invention has an input coupled to the collector of transistor 14 and includes the resistor divider network of serially connected resistors 34 and 36 coupled between the collector of transistor 14 and a terminal at which is supplied a ground reference potential. A voltage sampling transistor 38 is utilized with the collector-emitter path thereof coupled to the collector of transistor 14 via resistor 40 and Zener diodes 42 and 44 to supply terminal 12. Supply terminal 12 is also coupled via resistor 46 to the ground reference potential.

In response to the voltage at the collector 14 increasing beyond a predetermined level set at the interconnection between resistors 34 and 36 to the base of transistor 38, transistor 38 is rendered conductive to cause Zener breakdown of Zener diodes 42 and 44. This will produce a voltage across resistor 46 which turns on transistors 27 and 28 to shunt the base current drive from transistor 14 rendering it nonconductive and, in turn, transistors 16 and 18 nonconductive to protect the ignition system during the high voltage condition. The over voltage detection circuit of the invention utilizes positive feedback in that when transistor 38 is rendered conductive the voltage at collector of transistor 14 increases which in turn renders transistor 38 more conductive to quickly shut off transistor 14.

A significant feature of the over voltage detection circuit of the invention is that the voltage at which the shunt shut down occurs is absolute, i.e., the level will not shift with temperature. This means that the voltage at which transistor 38 becomes conductive remains constant even though the temperature of the monolithic circuit may increase with operating conditions. The voltage remains constant with temperature because the negative temperature coefficient of the base-to-emitter voltage drops of transistors 27, 28 and 38 are offset by the positive temperature coefficients of Zener diodes 42 and 44.

Thus, what has been described is an over voltage detection circuit which is coupled to the collector of the series driver transistor of an electronic ignition system for sensing the voltage appearing thereat. In response to a high voltage condition occurring at the collector of the series driver transistor the over voltage detection circuit renders this device nonconductive to reduce power dissipation in the integrated circuit and for rendering the external Darlington amplifier of the ignition system nonconductive to protect the same.

We claim:

1. In a monolithic electronic ignition system including a series driver transistor, an over voltage detection circuit for sampling the magnitude of a voltage appearing at the collector of the series driver transistor for producing an output signal that can be utilized to render the series driver transistor nonconductive whenever the magnitude appearing at the collector thereof exceeds a predetermined level, comprising:

voltage translation means for translating the magnitude of the voltage appearing at the collector of the series driver transistor to a second level;

a sampling transistor having base, emitter and collector electrodes, said base being connected to said voltage translation means, said collector being coupled to the collector of the series driver transistor, said sampling transistor being rendered conductive when said translated voltage exceeds a predetermined threshold level; and circuit means coupled between said emitter of said sampling transistor and an output of the over voltage detection circuit for providing the output signal thereat when said sampling transistor is rendered conductive.

2. The over voltage detection circuit of claim 1 wherein said circuit means includes a first Zener diode coupled between said emitter of said sampling transistor and the output of the over voltage detection circuit.

3. The over voltage detection circuit of claim 2 wherein said circuit means further includes a second Zener diode coupled in series with said first Zener diode.

4. In a monolithic electronic ignition circuit including a series driver transistor for driving an external Darlington amplifier in response to dwell control signals generated in response to ignition timing signals and an amplifier circuit having an input and an output with said output being coupled to the base of the series driver transistor which receives the dwell control signals at said input for rendering the series driver transistor conductive and nonconductive accordingly, an over voltage detection circuit comprising:

voltage translation means coupled to the collector of the series driver transistor for translating the level of the voltage appearing at the collector thereof to a second level;

a sampling transistor having a base, emitter and collector, said base being coupled to said voltage translation means, said collector being coupled to the collector of the series driver transistor, said sampling transistor being rendered conductive when the translated voltage exceeds a predetermined threshold level; and circuit means coupled between the emitter of said sampling transistor and the input of the amplifier circuit such that said amplifier circuit causes the series driver transistor to be rendered nonconductive when said sampling transistor is rendered conductive.

5. The over voltage detection circuit of claim 4 wherein said circuit means includes at least one Zener diode.

6. The over voltage detection circuit of claim 5 wherein said circuit means includes a second Zener diode coupled in series with said first Zener diode between the emitter of said sampling transistor and the input of said circuit means.

* * * * *